United States Patent
Koike et al.

[11] Patent Number: 5,922,418
[45] Date of Patent: *Jul. 13, 1999

[54] METHOD OF FORMING A DLC FILM OVER THE INNER SURFACE OF GUIDE BUSH

[75] Inventors: Ryota Koike, Tokorozawa; Yukio Miya, Kawagoe; Osamu Sugiyama, Tokorozawa; Takashi Toida, Tokyo; Toshiichi Sekine, Kamifukuoka, all of Japan

[73] Assignee: Citizen Watch Co., Ltd., Tokyo, Japan

[*] Notice: This patent is subject to a terminal disclaimer.

[21] Appl. No.: 08/912,924

[22] Filed: Aug. 15, 1997

[30] Foreign Application Priority Data

Aug. 15, 1996 [JP] Japan ................... 8-215557

[51] Int. Cl.$^6$ ............... B05D 3/06; B05D 7/22; C23C 16/26
[52] U.S. Cl. ............ 427/577; 427/237; 427/238; 427/239; 427/249; 427/122
[58] Field of Search ............ 427/577, 249, 427/237, 238, 239, 122

[56] References Cited

U.S. PATENT DOCUMENTS 4,746,538   5/1988   Mackowski ................. 427/577
5,521,351   5/1996   Mahoney ................... 219/121.59

FOREIGN PATENT DOCUMENTS 4-141303   5/1992   Japan.
9-038801   2/1997   Japan.
9-038802   2/1997   Japan.

*Primary Examiner*—Roy V. King
*Attorney, Agent, or Firm*—Armstrong, Westerman, Hattori, McLeland & Naughton

[57] ABSTRACT

An auxiliary electrode which is to be connected to a ground potential or applied with a positive DC voltage is disposed in a center bore which forms an inner surface of a guide bush, and a ringlike dummy member made of a conductive material having an internal diameter equal to or larger than the diameter of the center bore of the guide bush with its both ends having a different diameter is placed on an end face of the guide bush opening the inner surface thereof so that one end having the smaller diameter contacts the end face of the guide bush with its center in alignment with the central axis of the center bore. A DLC film is formed over an inner surface of a guide bush which is in sliding contact with a workpiece held in the guide bush by disposing the guide bush in a vacuum vessel after evacuating the vessel and introducing a gas containing carbon, producing a plasma in a vacuum vessel by applying a DC voltage or a radio frequency power to the guide bush by the plasma CVD process.

14 Claims, 11 Drawing Sheets

Voltage applied to auxiliary electrode (V)

METHOD OF FORMING A DLC FILM OVER THE INNER SURFACE OF GUIDE BUSH

BACKGROUND OF THE INVENTION

1. Field of the Invention

The present invention relates to a guide bush mounted on an automatic lathe to support a rodlike workpiece for rotation and axial sliding at a position near a cutting tool (cutter), and a method of forming a hard carbon film over the inner surface of the guide bush to be in sliding contact with the workpiece.

2. Description of the Related Art

Guide bushes mounted on the column of an automatic lathe to hold a rodlike workpiece for rotation at a position near a cutting tool are classified into rotary guide bushes and stationary guide bushes. A rotary guide bush rotates together with a workpiece and holds the workpiece for axial sliding. A stationary guide bush remains stationary and holds a workpiece for rotation and axial sliding.

A guide bush of either type has a portion having a taper outer surface provided with slits to make the same portion elastic, a threaded portion to hold the guide bush on the column, and an inner surface for holding a workpiece. The inner surface always in sliding contact with a workpiece is liable to be worn and, particularly, the inner surface of a stationary guide bush is worn rapidly.

A guide bush proposed in JP-A No. 4-141303 has an inner surface to be in sliding contact with a workpiece, which slides and rotates on the inner surface, attached with a superhard alloy or a ceramic material attached to the inner surface by brazing or the like.

When the inner surface of a guide bush is attached with a superhard alloy or a ceramic material excellent in wear resistance and heat resistance, the wear of the inner surface of the guide bush can be reduced to some extent.

However, when the workpiece is subjected to heavy machining on an automatic lathe, in which the depth of cut is large and the cutting speed is high, the workpiece is damaged or seizing occurs due to decrease in the diametrical clearance between the guide bush and the workpiece even if the inner surface of the guide bush is attached with a superhard alloy or a ceramic material, because the superhard alloy and the ceramic material have a comparatively large coefficient of friction and a low thermal conductivity. Therefore, it has been difficult to increase the depth of cut and cutting speed.

The stationary guide bush has advantages that a workpiece can be accurately machined in a high roundness because the workpiece can be held so that its axis may not run out, less noise is generated, and the automatic lathe may be of a simple, compact construction.

However, the inner surface of the stationary guide bush is worn far more rapidly than that of the rotary guide bush and hence it is more difficult to increase depth of cut and cutting speed when the stationary guide bush is employed.

In order to solve the problem, the inventors have proposed to form a hard carbon film over the inner surface of a guide bush slidably contacting with a workpiece, which can drastically improve abrasion resistance of the inner surface of a guide bush without occurrence of damage to a workpiece nor seizing, and which can increase the cutting amount and machining speed of an automatic lathe.

The hard carbon film is formed of a hydrogenated amorphous carbon closely resembling diamond in properties. Therefore, hydrogenated amorphous carbon is also called diamond like carbon (DLC).

The hard carbon film (DLC film) has high hardness (not lower than Vickers 3000 Hv), is excellent in wear resistance and corrosion resistance, and has a small coefficient of friction (about $\frac{1}{8}$ of a superhard alloy).

There is a plasma CVD method (plasma Chemical Vapor Deposition Process) for forming a hard carbon film as a method of forming the aforementioned hard carbon film on the inner surface of the guide bush, in which, for example, a plasma is produced by evacuating a vessel to a vacuum of $5 \times 10^{-3}$ torr at which the film is formed in an atmosphere of a gas containing carbon and a DC voltage of $-3$ kV is applied to the guide bush by a DC power source.

However, since the hard carbon film is formed by decomposing the gas containing carbon mainly by the plasma produced around a region surrounding the guide bush in the plasma CVD method, the hard carbon film is formed uniformly on the outer surface of the guide bush, but the hard carbon film formed on the inner surface of the guide bush is inferior in adhesion and moreover inferior in film qualities, such as the hardness.

This is because the plasma in the center bore of the guide bush generates an abnormal discharge called a hollow discharge since electrodes of the same potential face each other in the space of the center bore. The hard carbon film formed by this hollow discharge is a polymer-like film which is inferior in adhesion and rigidity, and is easily peeled off the inner surface of the guide bush.

In the aforementioned method of forming a hard carbon film, the guide bush is applied with a DC voltage of $-3$ kV by a DC voltage power source at a vacuum of $5 \times 10^{-3}$ torr at which the film is formed.

In such a state of a vacuum of $5 \times 10^{-3}$ torr in the vacuum vessel, electric charges are liable to be concentrated in the space of the vacuum vessel, resulting in low impedance in the space. Therefore, an abnormal discharge, i.e., an arc discharge is liable to be caused at an instant when the plasma discharge starts.

Further, adhesion of the film to the guide bush depends on the film quality formed at this initial stage of forming the film because the time when the plasma discharge starts is the initial stage of forming the hard carbon film.

Accordingly, there arises a problem that the quality and adhesion of the hard carbon film is lowered and the hard carbon film is peeled off the inner surface of the guide bush when the abnormal discharge, i.e., the arc discharge, is generated at the initial stage of the plasma discharge.

Accordingly, the present invention is intended to solve such problems and to form a hard carbon film on the inner surface of a guide bush slidably contacting a workpiece with excellent quality and adhesion.

SUMMARY OF THE INVENTION

Therefore, the present invention provides a method of forming a hard carbon film over the inner surface of the bore of a guide bush which in sliding contact with a workpiece with excellent adhesion and quality.

Namely, the present invention is a method of forming a hard carbon film over the inner surface of a guide bush which is formed in a generally cylindrical shape so as to define a center bore in the axial direction, and one end portion of which has a taper outer surface, an inner surface in sliding contact with a workpiece and slits, and when the guide bush is mounted on an automatic lathe, the workpiece inserted into the center bore is held for rotation slidably in the axial direction near the cutting tool, and the method is characterized in having the following steps.

The guide bush is disposed in a vacuum vessel provided with a gas inlet port and an evacuation port.

An auxiliary electrode is inserted into the center bore which forms the inner surface of the guide bush, and the auxiliary electrode is connected to a ground potential or is applied with a positive DC voltage.

Further, a ringlike dummy member made of conductive material, having a diameter which is the same as or larger than that of the bore of the guide bush and having different diameter sizes at both ends thereof is disposed on an end face of the guide bush boring at the inner surface so that the end of a smaller diameter of the dummy member contacts the end face with its center in alignment with the central axis of the center bore.

Then, a plasma is produced in the vacuum vessel by introducing a gas containing carbon through the gas inlet port into the vacuum vessel after evacuating the vacuum vessel so that a hard carbon film of hydrogenated amorphous carbon is formed over the inner surface of the guide bush by the plasma CVD process.

The auxiliary electrode may be inserted into the center bore of the guide bush first, and then the guide bush may be disposed in the vacuum vessel in a state in which the auxiliary electrode is inserted therein.

As a method of producing a plasma in the vacuum vessel, there is a method of employing a vacuum vessel provided therein with an anode and a filament, applying a DC voltage to the guide bush disposed in the vacuum vessel, and applying a DC voltage to the anode and an AC voltage to the filament.

Or, there are other methods in which radio frequency power is applied to the guide bush disposed in the vacuum vessel so as to produce a plasma, or a plasma is produced only by applying a DC voltage to the guide bush, without using the anode and the filament.

The inner surface of the dummy member employed in this method of forming the hard carbon film over the inner surface of a guide bush may be shaped in either of the following ways.

The dummy member is formed in a cylindrical shape having steps on the inner surface to vary the diameter of the bore between the end portion of a smaller diameter and the end portion of a larger diameter.

The dummy member has a taper surface varying the diameter of the bore between the end portion of a smaller diameter and the end portion of a larger diameter, and has no steps on the inner surface.

Further, the dummy member has a tapered portion with the diameter of the bore varying with no steps and a cylindrical portion with the internal diameter not varied between the end portion with a smaller diameter and the end portion of a larger diameter.

Thus, by producing a plasma while a gas containing carbon is introduced into the vacuum vessel in a state in which the auxiliary electrode is inserted in the center bore of the guide bush, the hard carbon film can be formed quickly with excellent adhesion on the inner surface of the guide bush with uniform thickness from the open end through the depth therefrom.

Since the dummy member, which has a diameter of bore equal to or larger than the diameter of the center bore of the guide bush and has an end portion with a diameter larger on the side contacting the end face of the bore of the guide bush than that of the end portion opposite thereto, is disposed on the end face of the bore of the guide bush, the following function and effect can be obtained.

The hard carbon film can be formed over the inner surface with excellent efficiency by inducing a plasma into the center bore of the guide bush while an edge effect of the plasma in the vicinity of the end face of the bore of the guide bush is prevented, and uniformity of the hard carbon film formed on the inner surface is improved.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the present invention will be described hereinafter with reference to the drawings.

Figure 18:
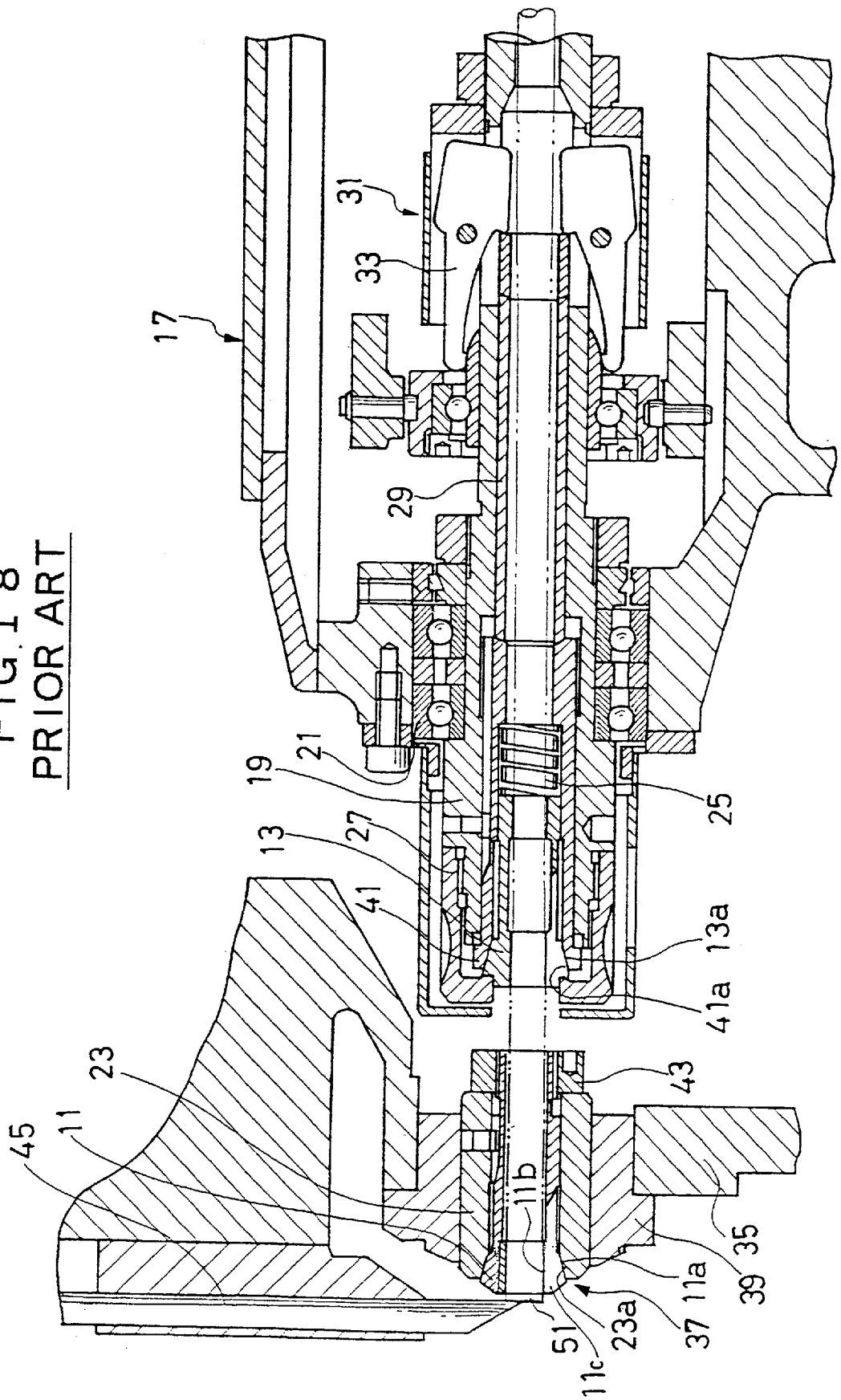
FIG. 18 is a sectional view showing only the vicinity of the shaft of an automatic lathe provided with a stationary guide bush unit.
Figure 19:
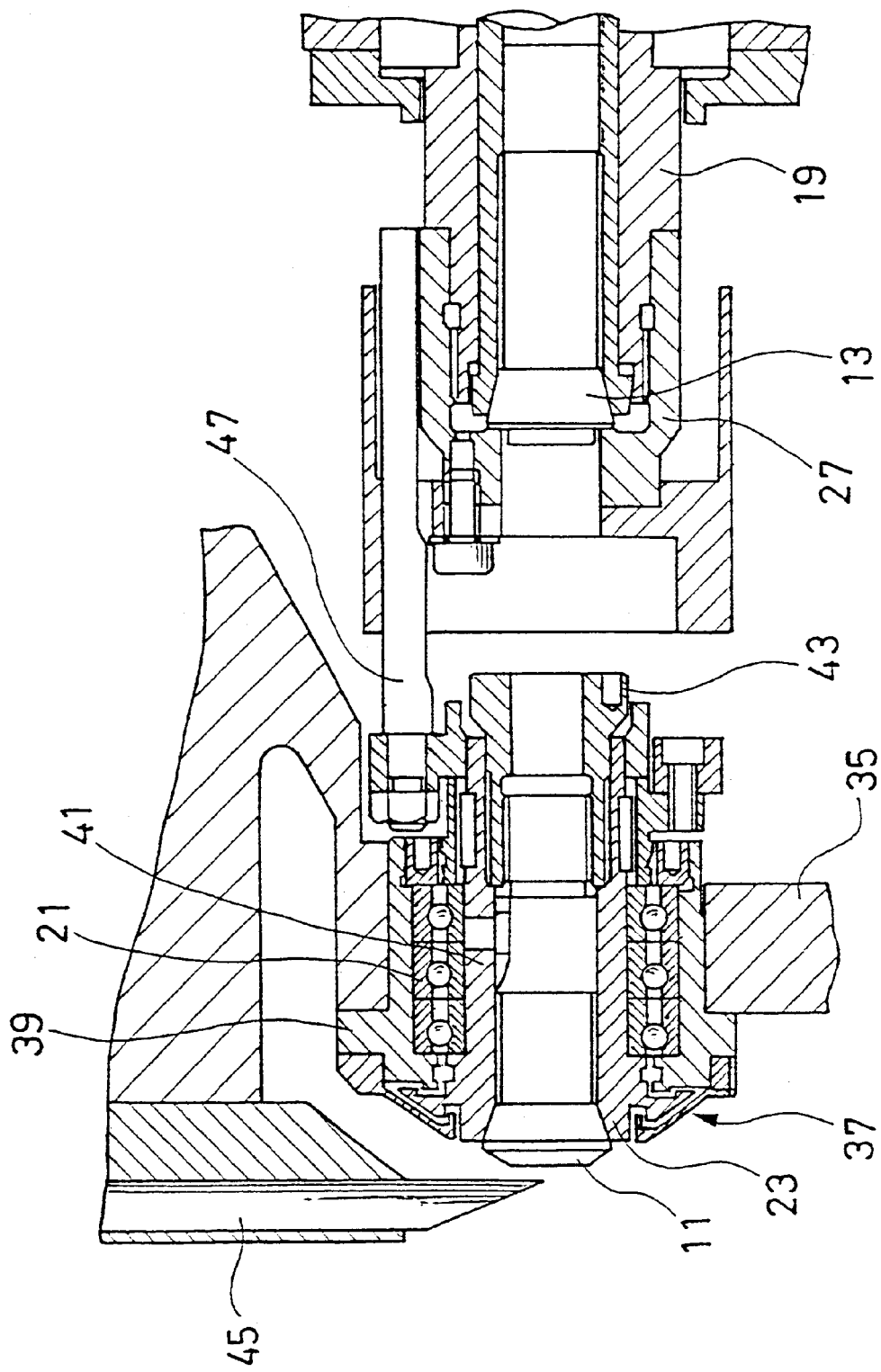
FIG. 19 is a sectional view showing only the vicinity of the shaft of an automatic lathe provided with a rotary guide bush unit.

Automatic Lathe Employing Guide Bush: FIGS. 18 and 19

The construction of an automatic lathe employing a guide bush for which the present invention is provided will be briefly described.

FIG. 18 shows only the vicinity of a spindle of a numerically controlled automatic lathe in a sectional view. The automatic lathe is provided with a stationary guide bush unit 37 that holds a guide bush 11 fixedly to support a workpiece 51 (indicated by imaginary lines) rotatably on the inner surface 11b of the guide bush 11.

A spindle stock 17 is mounted on the bed, not shown, of the numerically controlled automatic lathe for sliding movement in transverse directions, as viewed in FIG. 18.

A spindle 19 is supported for rotation in bearings 21 on the spindle stock 17, and a collet chuck 13 is mounted on the nose of the spindle 19.

The collet chuck 13 having a coned head having a taper outer surface 13a is inserted in the center bore of a chucking sleeve 41 with the taper outer surface 13a in close contact with a taper inner surface 41a formed in a front portion of the chucking sleeve 41.

A coil spring 25 formed by winding a spring band is inserted in an intermediate sleeve 29 at the back end of the collet chuck 13. The collet chuck 13 can be pushed out of the intermediate sleeve 29 by the action of the coil spring 25.

The position of the front end of the collet chuck 13 is determined by a cap nut 27 fastened to the front end of the spindle 19 with screws and in contact with the front end of the collet chuck 13. The cap nut 27 restrains the collet chuck 13 from being pushed out of the intermediate sleeve 29 by the force of the coil spring 25.

A chuck operating mechanism 31 provided with chuck operating levers 33 is provided on the back end of the intermediate sleeve 29. The chuck operating levers 33 are operated to open or close the collet chuck 13 so that the collet chuck 13 releases or chucks the workpiece 51.

When the chuck operating levers 33 of chuck operating mechanism 31 are turned so that the front ends thereof are moved away from each other, operating portions of the chuck operating levers 33 in contact with the intermediate sleeve 29 move to the left, as viewed in FIG. 18 to push the intermediate sleeve 29 to the left. Consequently, the chucking sleeve 41 in contact with the left end of the intermediate sleeve 29 moves to the left.

The collet chuck 13 is restrained from being pushed out of the spindle 19 by the cap nut 27 fastened to the front end of the spindle 19 with screws.

Therefore, when the chucking sleeve 41 is moved to the left, the taper inner surface 41a of the chucking sleeve 41 is pressed against the taper outer surface 13a of the slitted, coned head portion of the collet chuck 13 and the taper inner surface 41a of the chucking sleeve 41 moves to the left along the taper outer surface 13a of the collet chuck 13.

Consequently, collet chuck 13 is compressed and the inside diameter of the collet chuck 13 is reduced to grip the workpiece 51.

When releasing the workpiece 51 from the collet chuck 13 by expanding the collet chuck 13 so that the inside diameter of the collet chuck 13 is increased, the chuck operating levers 33 are turned so that the front ends thereof are moved toward each other to remove the force acting to the left on the chucking sleeve 41.

Then, the intermediate sleeve 29 and the chucking sleeve 41 are moved to the right as viewed in FIG. 18 by the stored energy of the coil spring 25.

Consequently, the pressure applied to the taper outer surface 13a of the collet chuck 13 by the taper inner surface 41a of the chucking sleeve 41 is removed to allow the collet chuck 13 to expand by its own resilience, so that the inside diameter of the collet chuck 13 increases to release the workpiece 51.

A column 35 is disposed in front of the spindle stock 17 and the guide bush unit 37 is placed on the column 35 with its center axis aligned with that of the spindle.

The guide bush unit 37 is of a stationary type fixedly holding the guide bush 11 to support the workpiece 51 rotatably on the inner surface 11b of the guide bush 11.

A bush sleeve 23 is fitted in the center bore of a holder 39 fixed to the column 35. A taper inner surface 23a is formed in the front portion of the bush sleeve 23.

The guide bush 11 having a front portion provided with a taper outer surface 11a and slits 11c are fitted in the center bore of the bush sleeve 23.

The clearance between the inner surface of the guide bush 11 and the outer surface of the workpiece 51 can be adjusted by turning an adjusting nut 43 screwed on the threaded portion of the guide bush 11 and contiguous with the back end of the guide bush unit 37.

When the adjusting nut 43 is turned clockwise, the guide bush 11 moves to the right, as viewed in FIG. 18, relative to the bush sleeve 23 and the taper outer surface 11a of the guide bush 11, similarly to the taper outer surface of the collet chuck 13, is compressed by the taper inner surface 23a of the bush sleeve 23 and the inside diameter of the slitted front portion of the guide bush 11 is reduced.

A cutting tool (cutter) 45 is disposed in further front of the guide bush unit 37.

The workpiece 51 is chucked by the collet chuck 13 mounted on the spindle 19 and supported by the guide bush unit 37. A portion of the workpiece 51 projecting from the guide bush unit 37 into a machining region is machined for predetermined machining by a combined motion of the cross feed motion of the cutting tool 45 and the longitudinal traverse motion of the spindle stock 17.

A rotary guide bush unit that supports rotatably a guide bush gripping a workpiece will be described with reference to FIG. 19, in which parts like or corresponding to those shown in FIG. 18 are designated by the same reference characters.

Rotary guide bush units are classified into those holding a guide bush 11 so as to rotate in synchronism with the collet chuck 13 and those holding a guide bush 11 so as to rotate in asynchronism with the collet chuck 13. A guide bush unit 37 shown in FIG. 30 holds the guide bush 11 so as to rotate in synchronism with the collet chuck 13.

The rotary guide bush unit 37 is driven by a drive rod 47 projecting from the cap nut 27 mounted on the spindle 19. A gear mechanism or a belt-and-pulley mechanism may be used instead of the drive rod 47 for driving the guide bush unit 37.

The rotary guide bush unit 37 has a holder 39 fixed to a column 35. A bush sleeve 23 is inserted in the center bore of the holder 39 and is supported in bearings 21 on the holder 39, and the guide bush 11 is fitted in the center bore of the bush sleeve 23.

The bush sleeve 23 and the guide bush 11 are similar in construction to those illustrated in FIG. 18, respectively. The clearance between the inner surface of the guide bush 11 and the outer surface of the workpiece 51 can be adjusted by turning an adjusting nut 43 screwed on the threaded portion of the guide bush 11 which is contiguous with the back end of the guide bush unit 37.

This automatic lathe is the same in construction as the automatic lathe illustrated in FIG. 18 except that this automatic lathe is provided with the rotary guide bush unit 37, and hence the further description thereof will be omitted.

Figure 16:
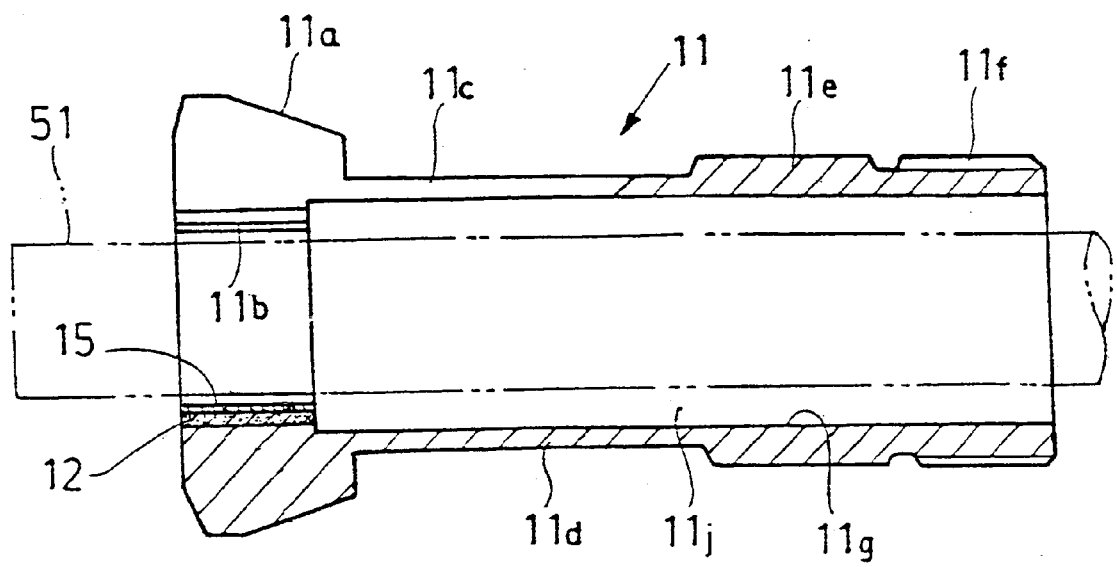
FIG. 16 is a longitudinal cross sectional view showing an example of a guide bush over the inner surface of which the hard carbon film is formed according to the present invention.
Figure 17:
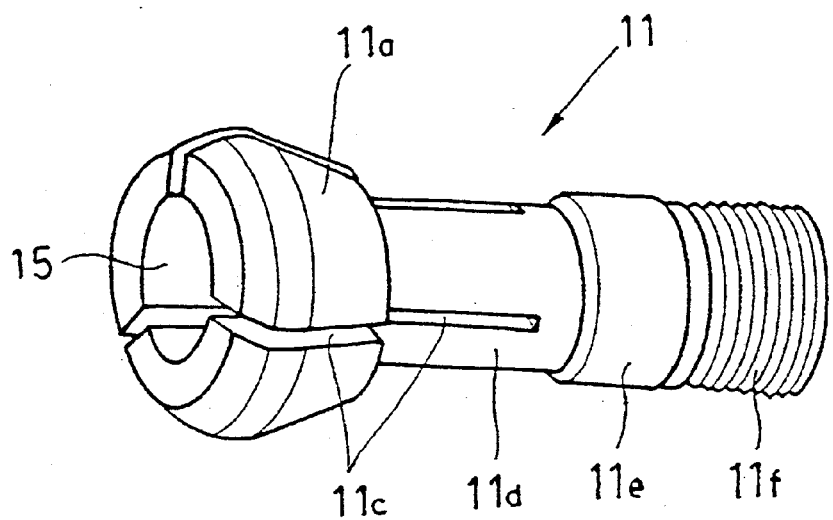
FIG. 17 is a perspective view showing the exterior thereof.

Description of Guide Bush: FIGS. 16 and 17

Guide bushes having an inner surface formed with the hard carbon film according to the method of the present invention will be described hereinafter.

FIGS. 16 is a longitudinal sectional view of a guide bush having an inner surface formed with the hard carbon film in a preferred embodiment according to the present invention, and FIG. 17 is a perspective view showing its exterior.

Referring to FIGS. 16 and 17, a guide bush 11 is shown in a free state in which a front end portion is open. The guide bush 11 is shaped substantially like a cylinder with a center bore 11j in the axial direction thereof and a head portion having a taper outer surface 11a in one longitudinal end thereof, a threaded portion 11f in the other longitudinal end thereof.

Further, an inner surface 11b for holding the workpiece 51 is formed on the inner circumference of a side where the taper outer surface 11a is provided. A stepped section 11g having an internal diameter greater than that of the inner surface 11b is formed in the region of the center bore 11j other than that of the inner surface 11b.

Three slits 11c are formed at angular intervals of 120° so as to extend through the head portion having the taper outer surface 11a and an elastic bendable portion 11d.

Figure 14:
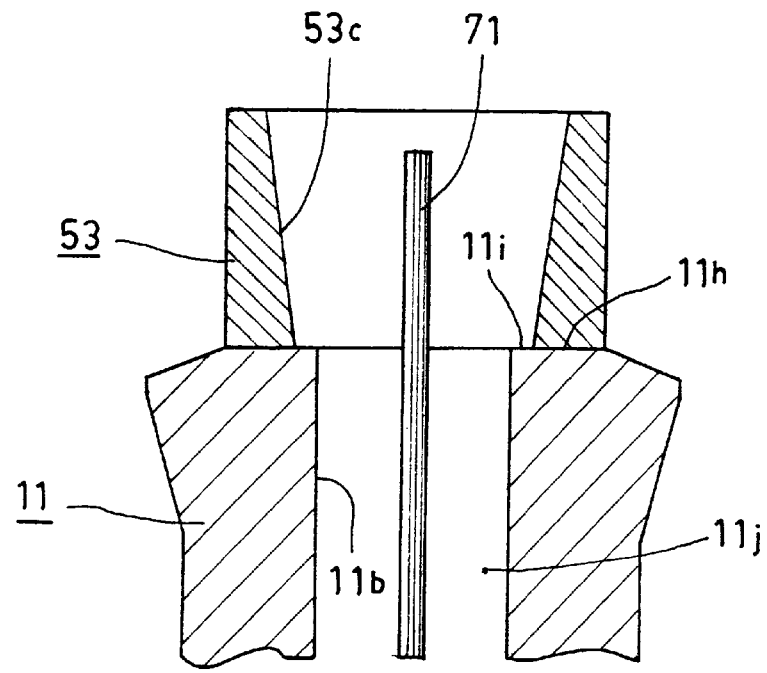

The clearance between the inner surface 11b and the workpiece 51 indicated by imaginary lines in FIG. 14 can be adjusted by pressing the taper outer surface 11a of the guide bush 11 by the taper inner surface of the bush sleeve, so that the elastic bendable portion 11d is bent.

The guide bush 11 has a fitting portion 11e between the elastic bendable portion 11d and the threaded portion 11f. When the guide bush 11 is fitted in the center bore of the bush sleeve 23 (FIGS. 18 and 19), the fitting portion 11e fits the center bore closely to set the guide bush 11 with its axis in alignment with the center axis of the spindle.

The guide bush 11 is made of alloy tool steel (SKS). When forming the guide bush 11, a workpiece of carbon tool steel is machined in redetermined external and internal shapes, and the machined workpiece is subjected to quenching and annealing.

Preferably, a superhard lining 12 having a thickness of 2 mm to 5 mm is attached to the inner surface 11b of the guide bush 11 as shown in FIG. 16 by brazing so as to form the inner surface 11b which contacts the workpiece 51.

The superhard linking is composed of, for example, 85% to 90% tungsten (W), 5% to 7% carbon (C), and 3% to 10% cobalt (Co) as binder.

When the head portion having the taper outer surface 11a is compressed, a clearance in the range of 5 to 10 $\mu$m is formed between the inner surface 11b and the workpiece 51 in the radial direction thereof to allow the workpiece 51 to slide relative to the guide bush 11, which abrades the inner surface 11b.

When the guide bush 11 is used on a stationary guide bush unit, the workpiece 51 supported on the guide bush 11 rotates at a high surface speed relative to the inner surface 11b and, when an excessively high pressure is applied to the inner surface 11b by the workpiece 51, seizing may occur.

Therefore, the inner surface 11b of the guide bush 11 is coated with a hard carbon film (DLC film) 15 of a thickness in the range of 1 to 5 $\mu$m.

The hard carbon film is very similar in properties to diamond as described above; the hard carbon has a high mechanical strength, a small coefficient of friction, a satisfactory self-lubricity, and excellent corrosion resistance.

The hard carbon film 15 covering the inner surface 11b enhances the wear resistance of the guide bush remarkably, the guide bush 11 withstands an extended period of use and heavy machining, the wear of the inner surface 11b in contact with the workpiece 51 is reduced, the possibility of exerting abrasive damage to the workpiece 51 is reduced, and seizing between the guide bush 11 and the workpiece 51 can be avoided.

Although the hard carbon film can be formed directly over the inner surface of the base material (SKS) for the guide bush 11 or over the inner surface of the superhard linking 12, it may be formed by way of a thin intermediate layer (not illustrated) for enhancing adhesion to the inner surface 11b.

An element of group IVb in the periodic table of elements, such as silicon (Si) or germanium (Ge), a compound containing silicon or germanium, or a compound containing carbon, such as a silicon carbide (SiC) or titanium carbide (TiC) may be used as the intermediate layer. A compound of titanium (Ti), tungsten (W), molybdenum (Mo) or tantalum (Ta) and silicon (Si) may be applicable for the intermediate layer.

The intermediate layer may be a two-layer film consisting of a lower layer of titanium (Ti) or chromium (Cr), and an upper layer of silicon (Si) or germanium (Ge).

The titanium or chromium comprising the lower layer of the intermediate layer which works for enhancing adhesion to the base material of the guide bush 11 or the superhard lining 12, and silicon or germanium of the upper layer which works for forming covalent bond which bonds the hard carbon film 15 firmly.

The thickness of the intermediate layer is to be approximately 0.5 $\mu$m. However, in case the intermediate layer comprises two layers, the thickness of the upper and lower layers are to be respectively approximately 0.5 $\mu$m.

The intermediate layer may be formed by a sputtering process, an ion plating process, a chemical vapor deposition (CVD) process or a metal spraying process.

When the superhard lining 12 is made of silicon carbide (SiC), the intermediate layer 16 may be omitted, because silicon carbide is a compound of silicon and carbon included in group IVb of the periodic table of elements and silicon carbide and the hard carbon film 15 formed on the superhard lining 12 make covalent bonds which secure high adhesion.

The hard carbon film is formed directly over the inner surface 11b of the guide bush 11 or by way of the intermediate layer by employing an auxiliary electrode and a dummy member in a vacuum vessel in the plasma CVD method, details of which will be described later.

Hard Carbon Film Forming Method

A method of forming the hard carbon film over the inner surface of a guide bush, in a preferred embodiment according to the present invention will be described next with reference to FIG. 1 through FIG. 8. In these drawings, although the superhard lining and the intermediate layer are not illustrated at the portion where the inner surface of the guide bush is formed, it is obvious that the respective embodiments may be applicable to the guide bush provided with them.

Figure 1:
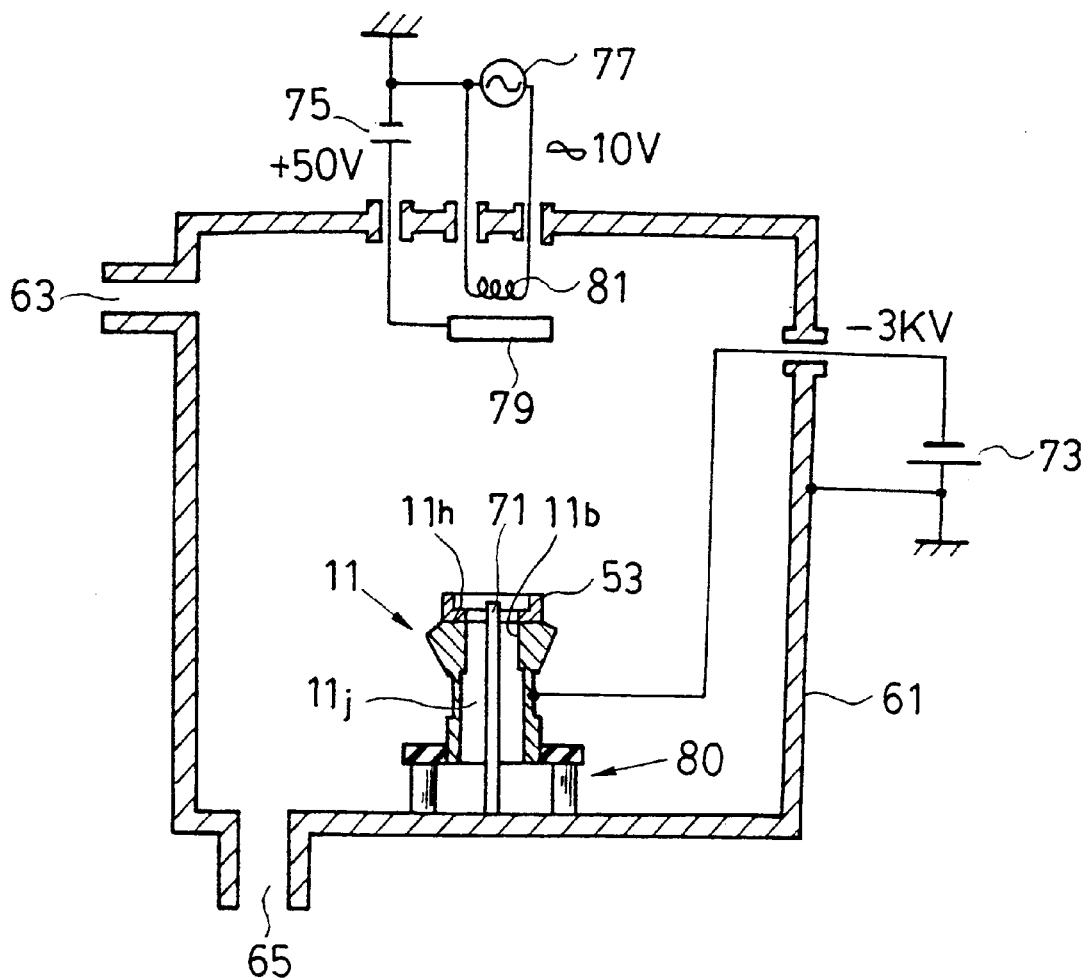
FIG. 1 is a schematic sectional view of an apparatus employed in the first embodiment in the method of forming the hard carbon film over the inner surface of a guide bush according to the present invention.
Figure 2:
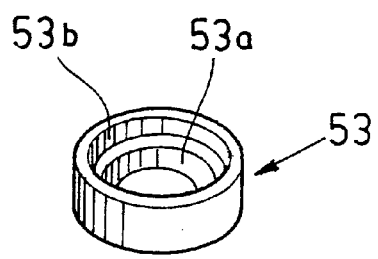
FIG. 2 is a perspective view of a dummy member shown in FIG. 1.

First Preferred Embodiment: FIGS. 1 and 2

FIG. 1 is a cross sectional view of an apparatus employed in the first embodiment in the method of forming a hard carbon film over the inner surface of the guide bush according to the present invention.

FIG. 1 shows a first apparatus for forming the hard carbon film 15. A vacuum vessel 61 is provided with a gas inlet port 63 and an evacuation port 65. An anode 79 and a filament 81 are disposed in the upper central region of the inner space of the vacuum vessel 61. The guide bush 11 is mounted fixedly in an upright position on an insulating support 80 disposed in the lower central region of the inner space of the vacuum vessel 61.

An auxiliary electrode 71 having the shape of a thin rod and supported in the vacuum vessel 61 is disposed to extend in the center bore 11j of the guide bush 11 substantially coaxially with the center bore 11j of the guide bush 11 and is connected through the vacuum vessel 61 to a ground potential.

The auxiliary electrode 71 is made of a metal, such as stainless steel, and is connected to a ground potential by way of the vacuum vessel 61.

Further, a ringlike dummy member 53 having a bore with a diameter which is the same as or larger than that of the bore defined by the inner surface 11b of the guide bush 11 and having different internal diameter sizes at both ends thereof is disposed on an end face 11h of the center bore of the guide bush 11 so as to be in alignment with the central axis of the center bore 11j.

The dummy member 53 is formed in a ringlike shape (including a cylindrical shape) having an external diameter which is substantially the same size as that of the end face 11h of the guide bush 11 as shown in FIG. 2. The inner surface thereof is formed in steps between the end portion with the smaller diameter and the end portion with the larger diameter, the diameter of the bore being varied on the respective steps. In the illustrated example, the same consists of a small diameter portion 53a having a bore with the same diameter as that of the inner surface 11b of the guide bush 11 and a large diameter portion 53b having a bore with a larger diameter than that of the former.

When the dummy member 53 is disposed so that the lower end of the small diameter portion 53a contacts the end face 11h of the guide bush 11 in alignment with the axis of the center bore 11j of the guide bush, the inner surface of the small diameter portion 53a and the inner surface 11b of the guide bush 11 form a surface of the generally same level without steps.

The dummy member 53 is also formed of a conductive material such as stainless steel (SUS) like the auxiliary electrode 71. Accordingly, both the guide bush 11 and the dummy member 53 have the same potential all the time. It is desirable to dispose the auxiliary electrode 71 at an inner portion in a range of 1 mm to 2 mm inside the dummy member so as not to be projected out of the upper end face of the dummy member 53.

The outer surface of the guide bush 11 can be made to remain uncoated with the hard carbon film by covering the outer surface with a covering member such as aluminum foil, which is not illustrated.

Thus, the guide bush 11, the auxiliary electrode 71 and the dummy member 53 are disposed in the vacuum vessel 61, and thereafter the vacuum vessel 61 is evacuated to a vacuum of $3 \times 10^{-5}$ torr by sucking out gases through the evacuation port 65 from the vacuum vessel 61.

Then, benzene gas ($C_6H_6$), i.e., a gas containing carbon, is supplied through the gas inlet port 63 into the vacuum vessel 61 so that the pressure in the vacuum vessel 61 is maintained at a vacuum of $5 \times 10^{-3}$ torr.

Then, a negative DC voltage of −3 kV is applied to the guide bush 11 by a DC power source 73 and a positive DC voltage of +50 V is applied to the anode 79 by an anode power source 75. And an AC voltage of about 10 V is applied to the filament 81 by a filament power source 77 so that a current of 30 A flows through the filament 81.

Thereby, the hard carbon film of hydrogenated amorphous carbon formed on the exposed inner surface 11b of the guide bush 11 by the plasma produced in and around the region surrounding the guide bush 11 disposed in the vacuum vessel 61 by the plasma CVD process.

The hard carbon film forming method illustrated in FIG. 1 is able to produce the plasma not only around the outer surface of the guide bush but also around the inner surface of the same because the auxiliary electrode 71 is extended in the center bore 11j of the guide bush 11.

Therefore, hollow cathode discharge does not occur and the adhesion of the hard carbon film 15 is improved.

Since the distribution of potential with respect to the length of the inner surface of the guide bush 11 is uniform, the hard carbon film 15 can be formed in a uniform thickness over the inner surface 11b. Since the hard carbon film is deposited at a high deposition rate, the hard carbon film having a uniform thickness from the open end through the depth can be formed in a short time.

Desirably, the diameter of the auxiliary electrode 71 is determined so that a clearance of about 5 mm, i.e., a clearance for creating a plasma region, is formed between the auxiliary electrode 71 and the inner surface 11b on which the hard carbon film is formed. Desirably, the ratio of the diameter of the auxiliary electrode 71 to the diameter of the bore of the guide bush 11 is not greater than 1/10. When the auxiliary electrode 71 is to be formed in a small diameter, the same may be a wire.

Although the auxiliary electrode 71 in this embodiment is formed of a stainless steel, the same may be formed of a metal having a high melting point, such as tungsten (W) or tantalum (Ta). The auxiliary electrode 71 has a circular cross section.

On the other hand, the dummy member 53 employed in the embodiment works as follows.

Namely, in such a method of forming a hard carbon film on a guide bush 11, a plasma can be produced not only in a region surrounding the guide bush 11 but also around the inner surface of the bore of the guide bush 11. Electric charges are liable to be concentrated on the end face 11h of the guide bush 11 and the potential of a portion of the guide bush 11 around the end face tends to become higher, leading to a so-called edge effect. Here, the intensity of the plasma in the vicinity of the end face 11h of the guide bush 11 is greater than that in other regions thereof and is unstable.

Further, a region of the guide bush 11 around the end portion is subject to the influence of both the plasma produced in a region surrounding the guide bush 11 and that produced inside the guide bush 11.

When a hard carbon film is formed under such conditions, the adhesion of the hard carbon film differs slightly between at a region in a range of several millimeters away from the end face 11h of the guide bush 11 and at other regions thereof, and further, the quality of the film also differs slightly.

Therefore, by disposing the dummy member 53 at the end face 11h of the inner surface 11b of the guide bush 11 so as to form the hard carbon film as shown in FIG. 1, a region where the adhesion and the quality of the film are different is not formed instead on the inner surface 11b of the guide bush 11, but is formed on the inner surface of the dummy member 53.

When the diameter of the bore of the inner surface of the guide bush 11 is smaller than about 10 mm, the plasma produced between the auxiliary electrode 71 and the inner surface 11b of the guide bush becomes unstable as time passes, and the hard carbon film may not be formed.

However, by using the dummy member, a plasma is induced into the large internal diameter portion 53b having a larger diameter than that of the bore defined by the inner surface 11b of the guide bush 11, and is drawn into the center bore 11j of the guide bush 11 through the small internal diameter portion 53a so that the plasma produced between the auxiliary electrode 71 and the inner surface 11b is prevented from being unstable.

Figure 3:
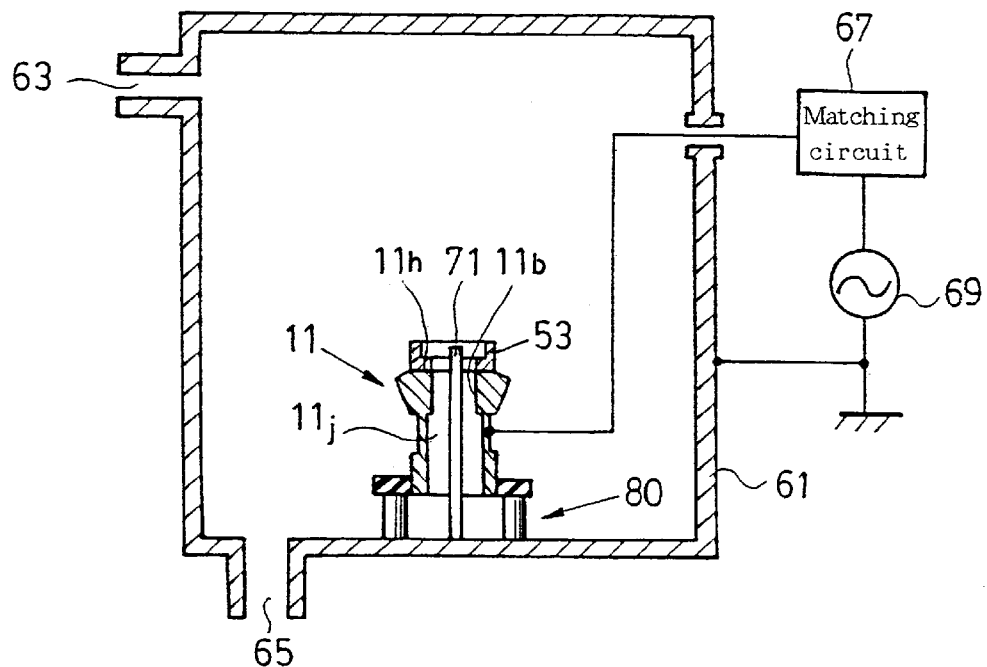
FIGS. 3, 4, 5, 6 and 7 are schematic sectional views of different apparatuses respectively employed in the second through the sixth embodiment for the method of forming the hard carbon film over the inner surface of a guide bush according to the present invention.

Second Preferred Embodiment: FIG. 3

A hard carbon film forming method in a second embodiment according to the present invention will be described next with reference to FIG. 3.

FIG. 3 is a sectional view of an apparatus employed in the second embodiment, in which parts corresponding to those shown in FIG. 1 are designated by the same reference characters and the description thereof will be omitted.

The vacuum vessel 61 employed in the second embodiment is not provided with any anode nor any filament.

The hard carbon film forming method using this apparatus differs from that of the first embodiment which uses the apparatus in the first embodiment shown in FIG. 1 only in that a radio frequency power of 400 W is applied to a guide bush 11 disposed in the vacuum vessel 61 through a matching circuit 67 by a radio frequency power source 69 of 13.56 MHz in oscillation frequency as shown in the drawing, and methane gas ($CH_4$) as a gas containing carbon is supplied into the vacuum vessel 61 so that the pressure in the vacuum vessel 61 is maintained at a vacuum of 0.1 torr.

A stable plasma is produced around both the outer and the inner surfaces and a hard carbon film is formed over the entire surface of the guide bush 11, and the hard carbon film can be formed in a uniform thickness and with excellent adhesion over the inner surface 11b of the guide bush 11 in a short time with excellent adhesion by the plasma CVD process.

The operation and effect by the auxiliary electrode 71 and the dummy member 53 are the same as in the first embodiment described before.

Figure 4:
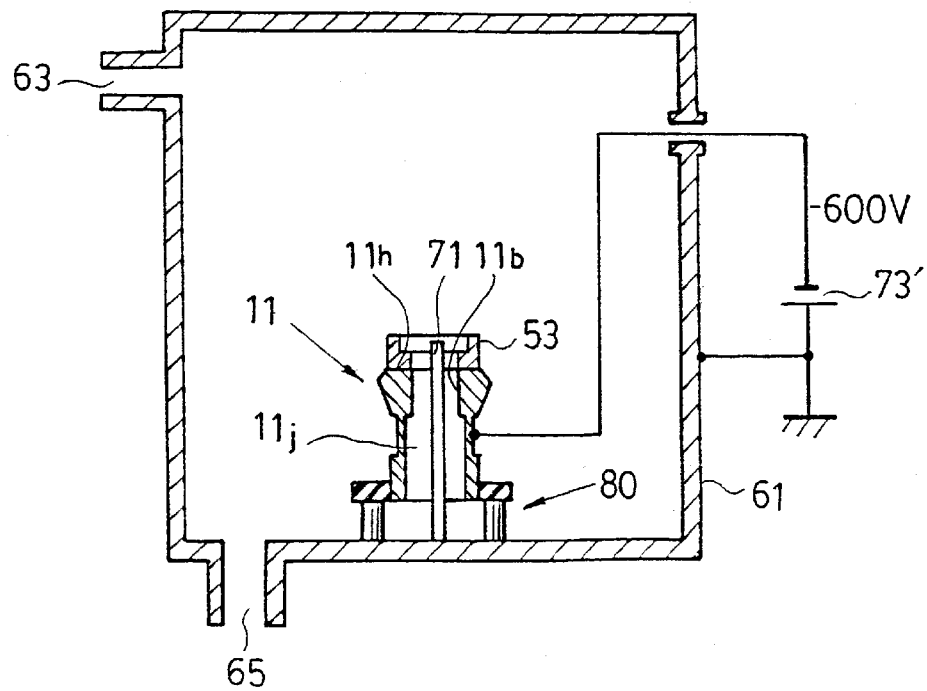

Third Preferred Embodiment: FIG. 4

A hard carbon film forming method in a third embodiment according to the present invention will be described next with reference to FIG. 4.

FIG. 4 is a sectional view of an apparatus employed in the third embodiment, in which parts like or corresponding to those shown in FIG. 1 are designated by the same reference characters and the description thereof will be omitted.

The vacuum vessel 61 employed in the third embodiment is not provided with any anode nor any filament.

The hard carbon film forming method using this apparatus differs from that of the first embodiment which uses the apparatus shown in FIG. 1 only in that only a DC voltage of −600 V is applied to a guide bush 11 disposed in the vacuum vessel 61 as shown in the drawing by a DC power source 73' and methane gas ($CH_4$) as a gas containing carbon is supplied into the vacuum vessel 61 so that the pressure therein is maintained at a vacuum of 0.1 torr.

A stable plasma is produced around both the outer and the inner surfaces of the guide bush 11 and the hard carbon film can be formed in a uniform thickness and with excellent adhesion over the inner surface 11b of the guide bush 11 in a short time by the plasma CVD process.

The operation and effect by the auxiliary electrode 71 and the dummy member 53 are the same as in the first embodiment described before.

Fourth, Fifth, Sixth Preferred Embodiments: FIG. 5 through FIG. 8

A hard carbon film forming method in fourth, fifth and sixth embodiments according to the present invention will be described next with reference to FIG. 5 through FIG. 8.

Figure 5:
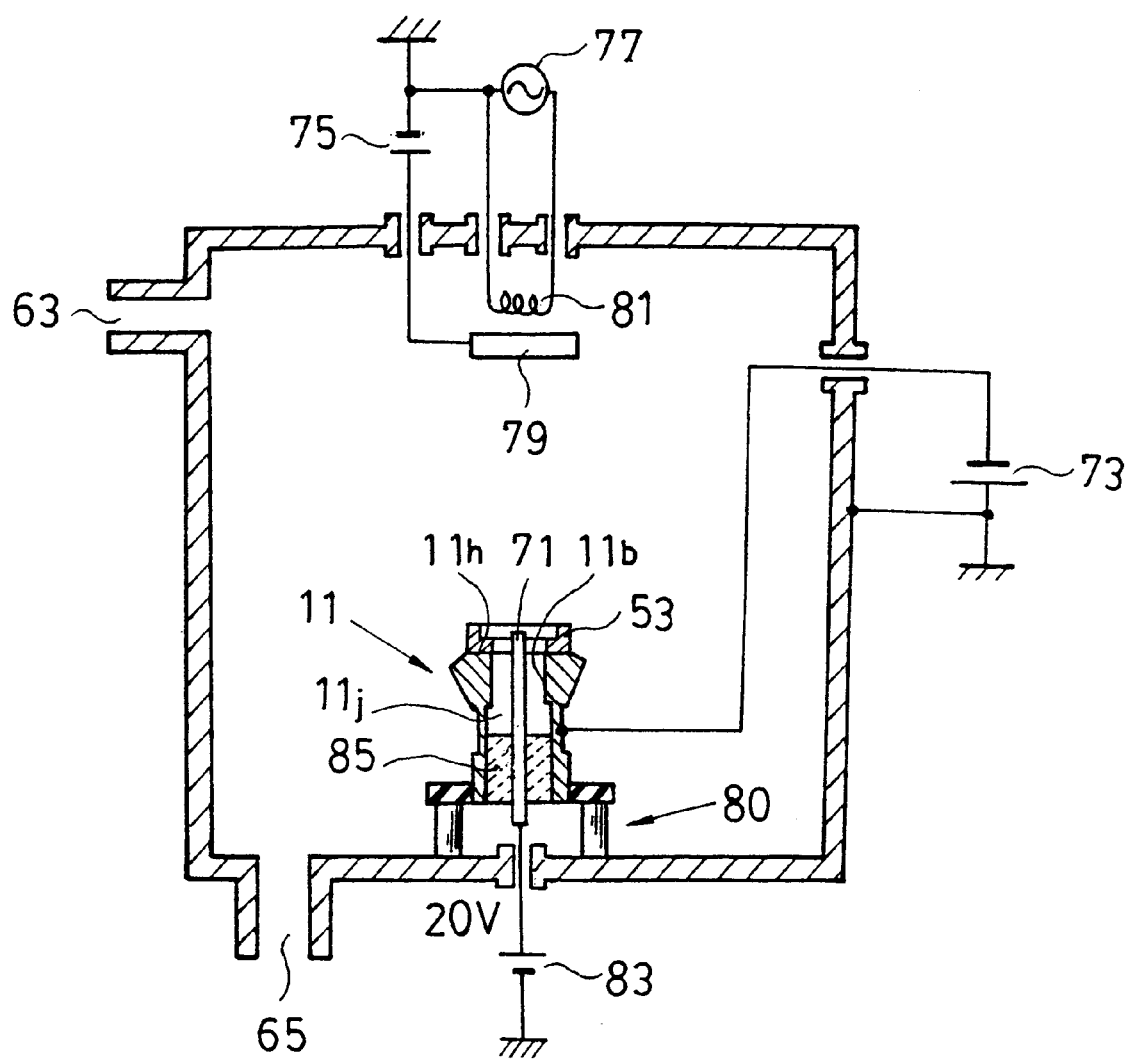
Figure 6:
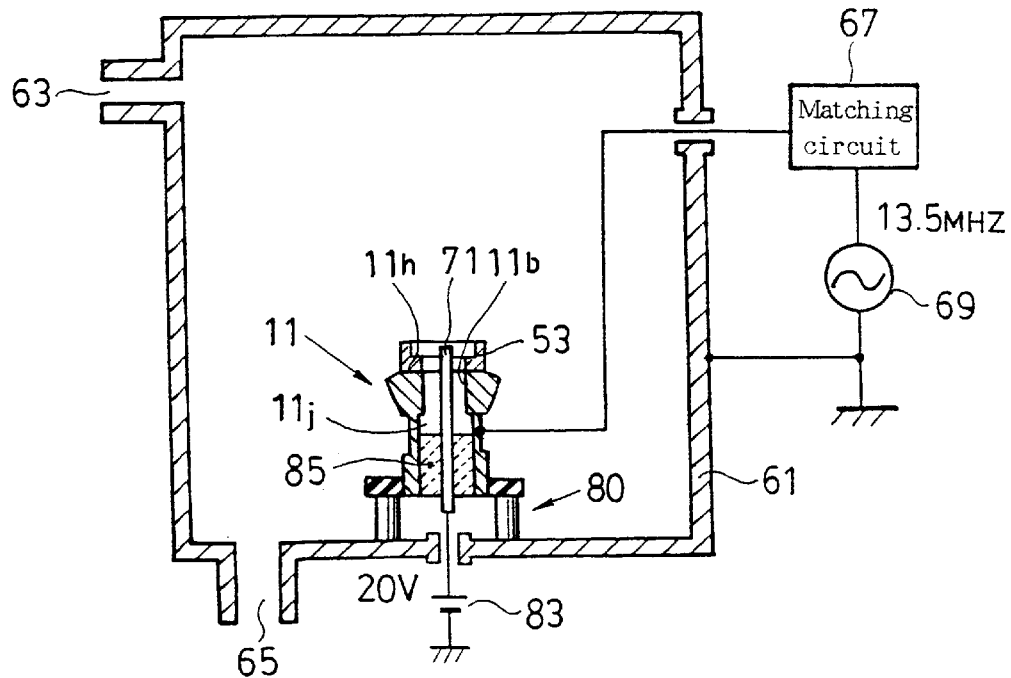
Figure 7:
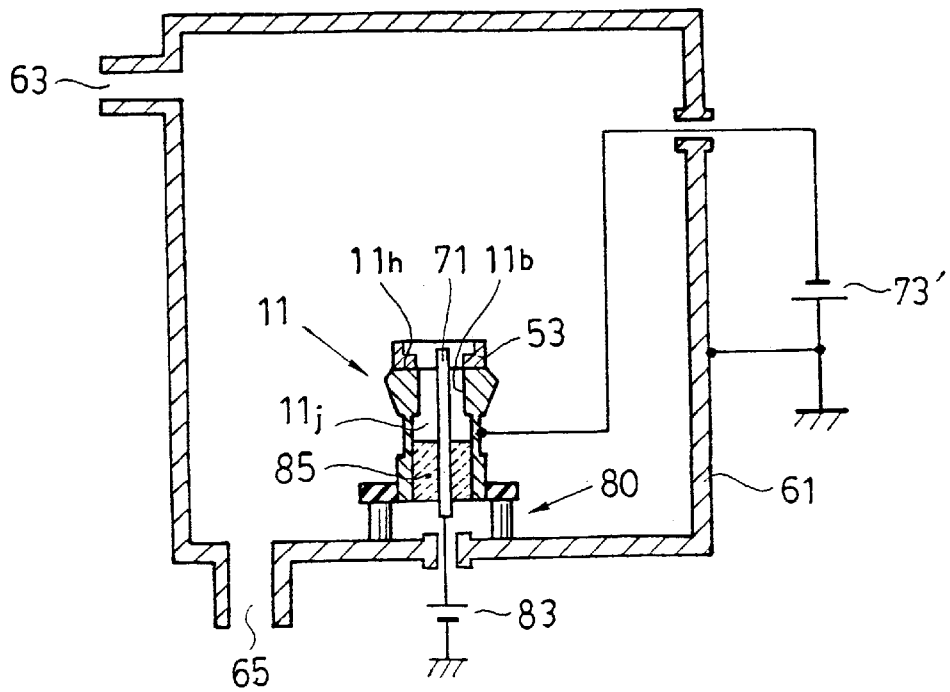

FIG. 5, FIG. 6 and FIG. 7 are sectional views showing an apparatus employed in the fourth, fifth, sixth embodiments according to the present invention, in which parts are almost the same as those shown in FIG. 1, FIG. 3 and FIG. 4, and are designated by the same reference characters and the description thereof will be omitted.

The hard carbon film forming methods in the fourth, fifth and sixth embodiments are different from the first, second, third embodiments only in that the auxiliary electrode 71 inserted in the guide bush 11 disposed in the vacuum vessel is supported on an insulating member 85 such as porcelain insulator received in the center bore 11j of a guide bush 11 so that the auxiliary electrode 71 is insulated from both the guide bush 11 and the vacuum vessel 61, and a positive DC voltage of, for example, 20 V is applied to the auxiliary electrode 71 by an auxiliary electrode power source 83.

Figure 8:
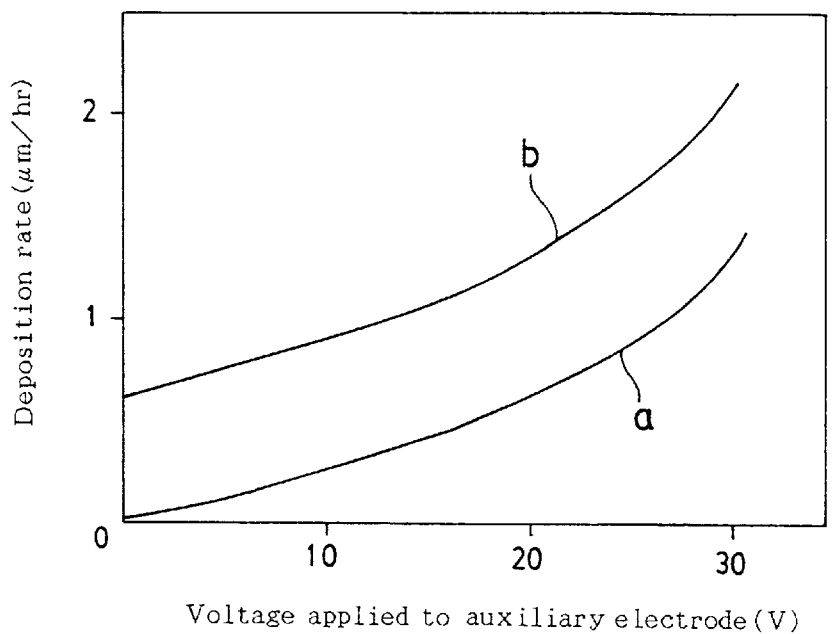
FIG. 8 is a graph showing the dependence of the thickness of the hard carbon film to be formed upon the positive DC voltage applied to the auxiliary electrode.

FIG. 8 shows the dependence of the thickness of a hard carbon film formed on the inner surface of the guide bush 11 on the positive voltage applied to the auxiliary electrode 71.

In FIG. 8, the thickness of the hard carbon film is shown when the clearance between the inner surface of the guide bush 11 and the auxiliary electrode 71 is 3 mm and 5 mm while the positive DC voltage applied to the auxiliary electrode 71 was varied from 0 V to 30 V. Characteristic curves a and b are for the clearances of 3 mm and 5 mm, respectively.

It is known from the curves a and b that the rate of deposition of the hard carbon film increases as the positive DC voltage applied to the auxiliary electrode 71 increases and the rate of deposition of the hard carbon film is higher when the clearance between the inner surface of the bore of the guide bush 11 and the auxiliary electrode 11 is greater.

No plasma is produced around the inner surface of the center bore 11j of the guide bush 11 nor can any hard carbon film be formed when a voltage of 0 V is applied to the auxiliary electrode 71 and the potential of the auxiliary electrode 71 is equal to the ground voltage and the clearance between the inner surface of the bore of the guide bush and the auxiliary electrode 71 is 3 mm (curve a).

A plasma is produced around the auxiliary electrode 71 within the center bore 11j of the guide bush 11 and a hard carbon film can be formed when the positive DC voltage applied to the auxiliary electrode 71 is increased even in the case mentioned above.

Therefore, according to the respective embodiments that applies a positive DC voltage to the auxiliary electrode 71, a hard carbon film can be formed over the inner surface of a guide bush having a center bore 11j of a small diameter.

All the methods of forming the hard carbon film over the inner surface 11b of the guide bush 11 employing the apparatus illustrated in FIGS. 5 to 7 have the same effect.

Example of Different Dummy Member: FIG. 9 through FIG. 15

Various examples of a dummy member 53 having an inner surface formed in a different shape are shown in FIG. 9 through FIG. 15.

The dummy member 53 is respectively formed of a metal (conductive material) such as stainless steel in a ringlike shape (including a cylindrical shape) having an external diameter substantially the same size as that of the end face 11h of the guide bush 11. The diameter of the bore at the lower end portion differs from that at the upper end portion, and the former has a diameter of the bore of the same size as or slightly larger than that of the bore defined by the inner surface 11b of the guide bush 11, while the upper end portion has a diameter which is sufficiently larger than that of the lower end portion.

Figure 9:
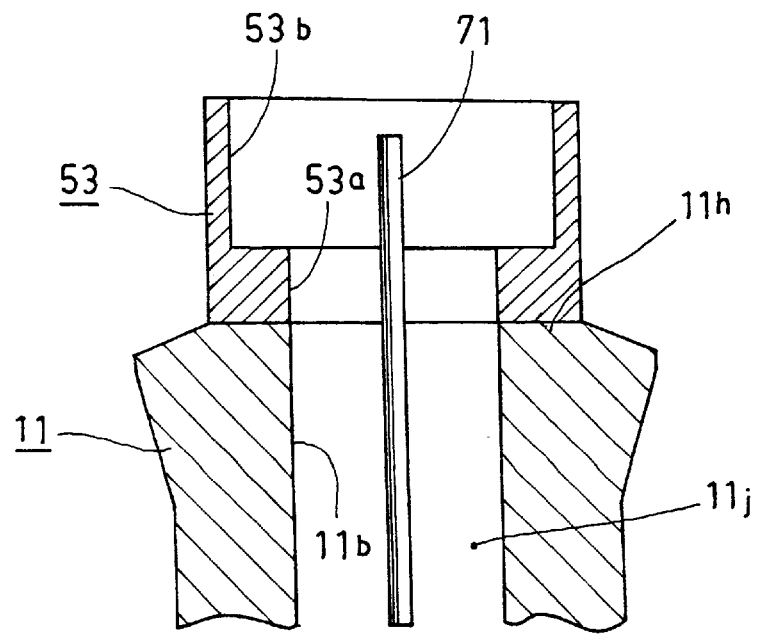
FIGS. 9, 10, 11, 12, 13, 14 and 15 are enlarged longitudinal cross sectional views of the main portion showing a state in which a dummy member respectively having an inner surface of a different shape is disposed on the end face of a guide bush into which an auxiliary electrode is inserted.

FIG. 9 is an enlarged cross sectional view of the main portion showing a state in which a dummy member 53 employed in the above embodiments is disposed on the end face 11h of a guide bush 11 into which an auxiliary electrode 71 is inserted.

The inner surface of the dummy member 53 shown in FIG. 9 consists of a small diameter portion 53a having a diameter of a bore thereof which is the same size as that of the bore defined by the inner surface 11b of the guide bush 11 and a large diameter portion 53b having a bore of a larger diameter than that of the former by about 2 mm to 5 mm. Accordingly, the inner surface of the dummy member 53 forms stepped cylindrical surfaces having two steps, the diameter being varied stepwisely between the upper end and the lower end.

When the dummy member 53 is disposed so that the lower end of the small diameter portion 53a contacts the end face 11h of the guide bush 11 in alignment with the axis of the center bore 11j of the guide bush as shown in the drawing, the inner surface of the small diameter portion 53a and the inner surface 11b of the guide bush 11 form a surface of the generally same level without steps.

Figure 10:
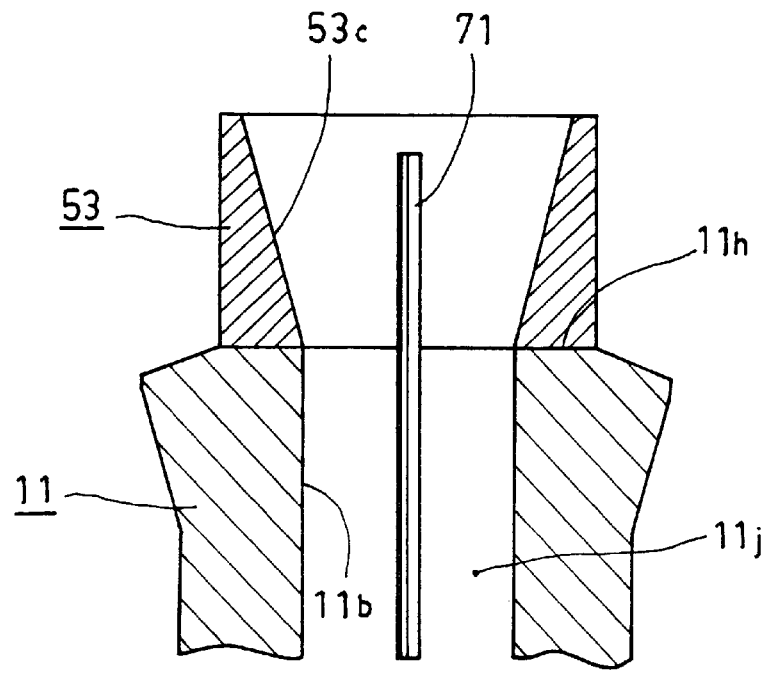

The dummy member 53 shown in FIG. 10 has a bore varying the diameter continuously with no steps between the lower end and the upper end, while the inner surface comprises only a tapered portion 53c forming the taper surface. The smallest internal diameter of the tapered portion 53c is equal to that of the inner surface 11b of the guide bush 11, and the largest internal diameter thereof is larger than the former by approximately 2 mm to 5 mm.

Figure 11:
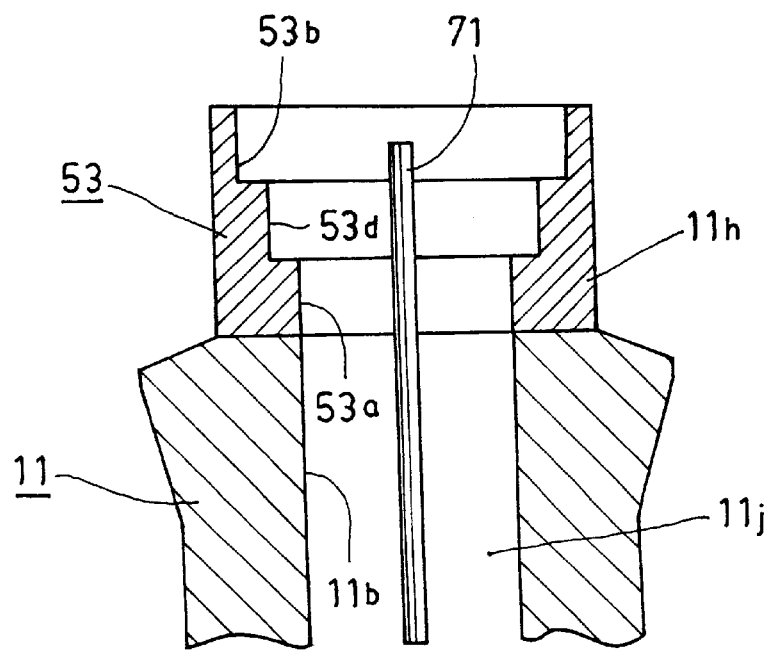

The dummy member 53 shown in FIG. 11 has an inner surface comprising a small diameter portion 53a, a medium diameter portion 53d and a large diameter portion 53b. The diameter of the small diameter portion 53a is equal to that of the inner surface 11b of the guide bush 11, while the diameter of the bore of the large diameter portion 53b is larger than that of the small diameter portion 53a by about 2 mm to 5 mm. The medium diameter portion 53d has a diameter of a size between those of the small diameter portion 53a and the large diameter portion 53b. That is, the inner surface of the dummy member 53 forms stepped cylindrical surfaces having three steps with different diameters.

Figure 12:
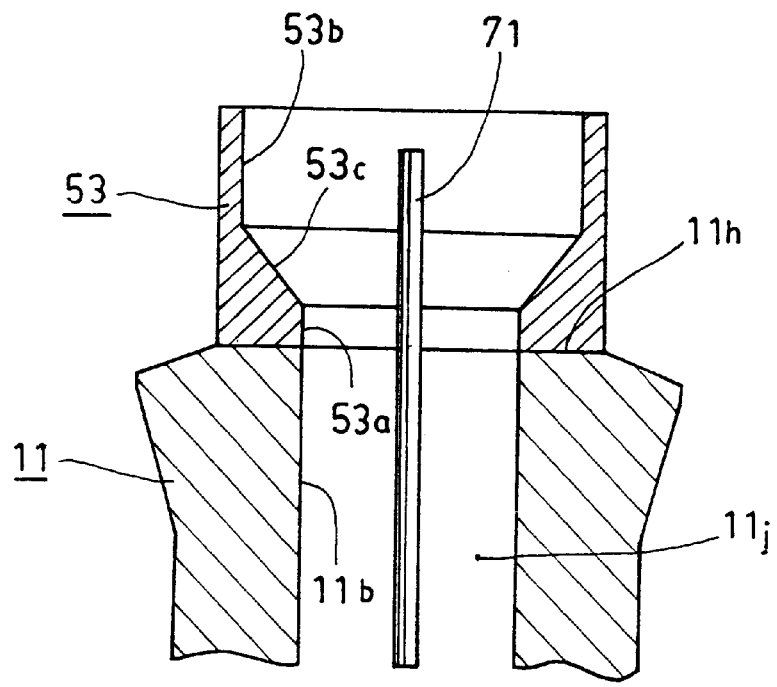

The dummy member 53 shown in FIG. 12 has an inner surface comprising a small diameter portion 53a, a large diameter portion 53b and a tapered portion 53c between the small diameter portion 53a and the large diameter portion 53b. The tapered portion 53c is formed to vary the diameter thereof gradually so that the diameter of the small diameter portion 53a is equal to the diameter of the bore of the inner surface 11b and the diameter of the large diameter portion 53b is larger than the former by approximately 2 mm to 5 mm.

Figure 13:
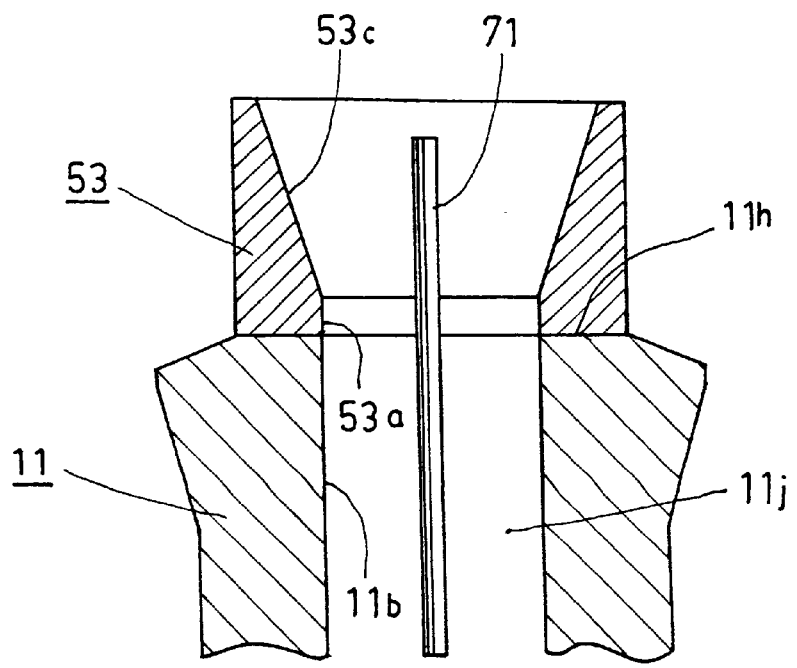

The dummy member 53 shown in FIG. 13 has an inner surface comprising a small diameter portion 53a and a tapered portion 53c. The diameter of the bore of the small diameter portion 53a is equal to that of the inner surface 11b of the guide bush 11 and the tapered portion 53c is formed to vary the diameter thereof gradually so that the largest diameter of the bore of the tapered portion 53c is larger than the former by approximately 2 mm to 5 mm.

Accordingly, the dummy members 53 shown in FIGS. 12 and 13 have an inner surface comprising a portion with a tapered portion and a cylindrical portion.

Figure 15:
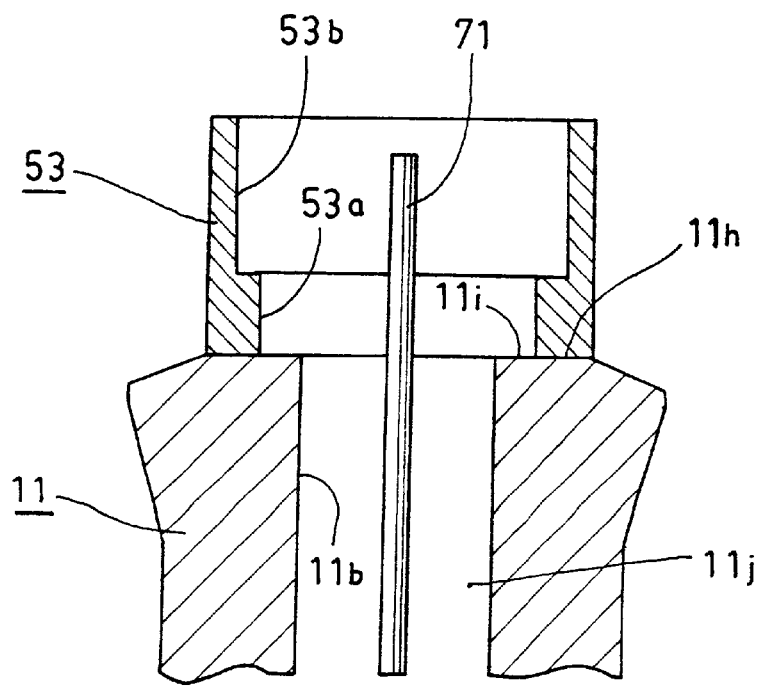

Although the dummy members 53 shown in FIGS. 14 and 15 either have an inner surface 53c similar to the dummy member 53 shown in FIGS. 10 and 9, or have inner surfaces 53a, 53b, the diameter of the bore of the lower end portion contacting the end face 11h of the guide bush 11 is slightly larger (approximately 2 mm) than the diameter of the inner surface 11b of the guide bush 11.

When such a dummy member is used, the end face 11h of the guide bush 11 boring the inner surface 11b is exposed in a ringlike shape in the vicinity 11i of the end of the bore when the hard carbon film is formed on the inner surface 11b of the guide bush 11, and the hard carbon film can be also formed thereon. Thereby, durability of the guide bush at an end portion of the bore which is easily abraded can be enhanced.

However, in view of improving the uniform quality of the film, it is less effective because of the slight step at an end portion of a bore of the inner surface 11b.

The dummy member 53 respectively shown in the drawings can be used as the dummy member 53 according to the first through the sixth embodiments described above.

Then, the plasma can be induced more smoothly into the region surrounding the auxiliary electrode 71 inside the center bore 11j of the guide bush 11 than when the diameter of the bore is formed evenly along the entire length of the axis thereof since any one of the dummy members 53 has a tapered portion on the inner surface or a cylindrical inner surface shaped in steps, the diameter varying stepwise.

Accordingly, a more stable plasma can be produced around the auxiliary electrode 71 inside the center bore 11j of the guide bush 11, thereby forming an excellent hard carbon film effectively and reliably.

Supplementary Explanation

Although the respective foregoing hard carbon film forming methods according to the present invention use methane ($CH_4$) gas or benzene ($C_6H_6$) gas as a gas containing carbon, the hard carbon film forming methods may use ethylene ($C_2H_4$), hexane ($C_6H_{14}$) or the like.

These gases containing carbon may be diluted by an inert gas that is ionized at a relatively low ionization potential, such as argon (Ar), to stabilize the plasma produced in the center bore of the guide bush.

A small amount of an additive (1% or less) may be added to the gas containing carbon for forming the hard carbon film to enhance lubricity or hardness.

Addition of, for example, fluorine (F) or boron (B) to the gas containing carbon increases lubricity. Addition of, for example, chromium (Cr), molybdenum (Mo) or tungsten (W) to the gas containing carbon increases hardness.

It is desirable to produce a plasma of argon (Ar) or nitrogen ($N_2$) after placing the guide bush in the vacuum vessel prior to forming the hard carbon film to bombard the inner surface of the guide bush, and to produce a plasma of the gas containing carbon, such as methane gas or benzene gas, for forming the hard carbon film.

This pretreatment using bombardment with an inert gas increases the temperature of the inner surface of the guide bush, activates the inner surface and drives out impurities from the inner surface of the guide bush to clean the inner surface. These effects further improve the adhesion of the hard carbon film to the inner surface of the guide bush.

What is claimed is:

1. A method of forming a diamond-like carbon (DLC) film over the inner surface of a guide bush which is formed substantially in a cylindrical shape having a center bore in its axial direction and has a taper outer surface on one end thereof, an inner surface to be in sliding contact with a workpiece, and slits, for holding a workpiece inserted into the center bore thereof rotatably and axially slidable on an automatic lathe at a position near a cutting tool, wherein said guide bush is disposed in a vacuum vessel having a gas inlet port and an evacuation port, an auxiliary electrode is disposed in the center bore which forms the inner surface of the guide bush while the electrode is connected to a ground potential, a ringlike dummy member which is made of a conductive material having an inside diameter equal to or larger than the diameter of the center bore of the guide bush and has a different diameter at both ends thereof is put on an end face of the guide bush boring at end of the inner surface so that one end portion having the smaller diameter contacts the end face of the guide bush with its center in alignment with the central axis of the center bore of the guide bush, a gas containing carbon is introduced through the gas inlet port into the vacuum vessel after evacuating the vacuum vessel, and a plasma is produced in the vacuum vessel so as to form the diamond-like carbon (DLC) film of hydrogenated amorphous carbon over the inner surface of the guide bush by the plasma CVD process.

2. A method of forming a diamond-like carbon (DLC) film over the inner surface of a guide bush according to claim 1, wherein a vacuum vessel having an anode and a filament is employed so that the plasma is produced by applying a DC voltage to the guide bush, a DC voltage to the anode, and an AC voltage to the filament.

3. A method of forming a diamond-like carbon (DLC) film over the inner surface of a guide bush according to claim 1, wherein a radio frequency power is applied to the guide bush so as to produce the plasma in the vacuum vessel.

4. A method of forming a diamond-like carbon (DLC) film over the inner surface of a guide bush according to claim 1, wherein a DC voltage is applied to the guide bush so as to produce the plasma in the vacuum vessel.

5. A method of forming a diamond-like carbon (DLC) film over the inner surface of a guide bush which is formed substantially in a cylindrical shape having a center bore in its axial direction and has a taper outer surface on one end thereof, an inner surface to be in sliding contact with a workpiece, and slits, for holding a workpiece inserted into the center bore thereof rotatably and axially slidable on an automatic lathe at a position near a cutting tool, wherein said guide bush is disposed in a vacuum vessel having a gas inlet port and an evacuation port, an auxiliary electrode is disposed in the center bore which forms the inner surface of the guide bush and a positive DC voltage is applied thereto, a ringlike dummy member which is made of a conductive material having an inside diameter equal to or larger than the diameter of the center bore of the guide bush and has a different diameter at both ends thereof is put on an end face of the center bore of the guide bush so that one end having the smaller diameter contacts the end face of the guide bush with its center in alignment with the central axis of the center bore of the guide bush, a gas containing carbon is introduced through the gas inlet port into the vacuum vessel after evacuating the vacuum vessel, and a plasma is produced in the vacuum vessel so as to form the diamond-like carbon (DLC) film of hydrogenated amorphous carbon over the inner surface of the guide bush by the plasma CVD process.

6. A method of forming a diamond-like carbon (DLC) film over the inner surface of a guide bush according to claim 5, wherein a vacuum vessel having an anode and a filament is employed so that the plasma is produced by applying a DC voltage to the guide bush, a DC voltage to the anode, and an AC voltage to the filament.

7. A method of forming a diamond-like carbon (DLC) film over the inner surface of a guide bush according to claim 5, wherein a radio frequency power is applied to the guide bush so as to produce the plasma in the vacuum vessel.

8. A method of forming a diamond-like carbon (DLC) film over the inner surface of a guide bush according to claim 5, wherein a DC voltage is applied to the guide bush so as to produce the plasma in the vacuum vessel.

9. A method of forming a diamond-like carbon (DLC) film over the inner surface of a guide bush according to claim 1, wherein a dummy member which has a stepped cylindrical inner surface, the internal diameter thereof varying stepwise between the end portion with a small diameter and the end portion with a large diameter, is employed as the dummy member.

10. A method of forming a diamond-like carbon (DLC) hard carbon film over the inner surface of a guide bush according to claim 5, wherein a dummy member which has a stepped cylindrical inner surface, the internal diameter thereof varying stepwise between the end portion with a small diameter and the end portion with a large diameter, is employed as the dummy member.

11. A method of forming a diamond-like carbon (DLC) film over the inner surface of a guide bush according to claim 1, wherein a dummy member which has a tapered inner surface, the internal diameter thereof varying gradually with no steps between the end portion with a small diameter and the end portion with a large diameter, is employed as the dummy member.

12. A method of forming a diamond-like carbon (DLC) film over the inner surface of a guide bush according to claim 5, wherein a dummy member which has a tapered inner surface, the internal diameter thereof varying gradually with no steps between the end portion with a small diameter and the end portion with a large diameter, is employed as the dummy member.

13. A method of forming a diamond-like carbon (DLC) film over the inner surface of a guide bush according to claim 1, wherein a dummy member which has an inner surface comprising a tapered portion with the internal diameter thereof varying gradually with no steps between the end portion with a small diameter and the end portion with a large diameter and a cylindrical portion with the internal diameter thereof not varied, is employed as the dummy member.

14. A method of forming a diamond-like carbon (DLC) film over the inner surface of a guide bush according to claim 5, wherein a dummy member which has an inner surface comprising a tapered portion with the internal diameter thereof varying gradually with no steps between the end portion with a small diameter and the end portion with a large diameter and a cylindrical portion with the internal diameter thereof not varied is employed as the dummy member.

* * * * *